United States Patent
Sachin et al.

(10) Patent No.: US 9,731,957 B2
(45) Date of Patent: Aug. 15, 2017

(54) POLYMER ANCHORED MICROELECTROMECHANICAL SYSTEM (MEMS) CANTILEVER AND METHOD OF FABRICATING THE SAME

(71) Applicant: Indian Institute of Technology, Bombay, Powai, Mumbai, Maharashtra (IN)

(72) Inventors: Patkar Rajul Sachin, Maharashtra (IN); Apte Prakash Ramchandra, Maharashtra (IN); Rao Valipe Ramgopal, Maharashtra (IN)

(73) Assignee: INDIAN INSTITUTE OF TECHNOLOGY, BOMBAY, Powai, Mumbai, Maharashtra (IN)

( * ) Notice: Subject to any disclaimer, the term of this patent is extended or adjusted under 35 U.S.C. 154(b) by 0 days.

(21) Appl. No.: 14/601,919

(22) Filed: Jan. 21, 2015

(65) Prior Publication Data
US 2015/0203345 A1 Jul. 23, 2015

(30) Foreign Application Priority Data
Jan. 21, 2014 (IN) ............................ 204/MUM/2014

(51) Int. Cl.
*B81B 3/00* (2006.01)
*B81C 1/00* (2006.01)

(52) U.S. Cl.
CPC ..... *B81B 3/0021* (2013.01); *B81B 2203/0118* (2013.01)

(58) Field of Classification Search
CPC . B81C 1/00539; B81C 1/0015; H01L 41/047; H01L 41/094; H01L 41/0973;
(Continued)

(56) References Cited

U.S. PATENT DOCUMENTS 5,066,358 A  11/1991 Quate et al.
5,399,232 A   3/1995 Albrecht et al.
(Continued)

OTHER PUBLICATIONS

Olgac Ergeneman et al., Cobalt-nickel microcantilevers for biosensing, Journal of Intelligent Material Systems and Structures, Oct. 17, 2012, p. 2215-2220, vol. No. 24, Issue No. 18.
(Continued)

*Primary Examiner* — Evan Pert
*Assistant Examiner* — Changhyun Yi
(74) *Attorney, Agent, or Firm* — Tim Tingkang Xia, Esq.; Locke Lord LLP

(57) ABSTRACT

A microelectromechanical system (MEMS) cantilever includes a base and a cantilever beam projecting from the base. The cantilever beam includes a piezo layer sandwiched between an inorganic material structural layer and an inorganic material encapsulating and immobilizing layer. A pair of electrical contacts are formed in the encapsulating and immobilizing layer in contact with the piezo layer. The base consists of polymer. A method includes depositing a sacrificial layer on a substrate; forming a MEMS cantilever beam on the sacrificial layer by depositing an inorganic material structural layer thereon; depositing a piezo layer on the structural layer; and depositing an inorganic material encapsulating and immobilizing layer on the piezo layer; forming a pair of electrical contacts in the encapsulating and immobilizing layer in contact with the piezo layer; forming a polymer base for the cantilever beam; and etching the sacrificial layer to release the MEMS cantilever beam from the substrate.

4 Claims, 3 Drawing Sheets

(58) Field of Classification Search
CPC .. H01L 41/1134; H01L 41/1136; H01L 41/22; G01P 15/09; G01P 15/0922; G01P 15/0802; G01L 1/16; G01L 9/008; B81B 3/0021; B81B 2203/0118
USPC .......................................... 257/252; 73/105
See application file for complete search history.

(56) References Cited

U.S. PATENT DOCUMENTS

| | | |
|---|---|---|
| 6,136,208 A | 10/2000 | Chou et al. |
| 6,156,216 A | 12/2000 | Manalis et al. |
| 6,720,267 B1 | 4/2004 | Chen et al. |
| 6,886,395 B2 | 5/2005 | Minne |
| 7,022,540 B2 | 4/2006 | Kim et al. |
| 7,763,947 B2 | 7/2010 | Zhan et al. |
| 8,278,275 B2 | 10/2012 | Winslow et al. |
| 8,393,011 B2 | 3/2013 | Fragala et al. |
| 2005/0112621 A1* | 5/2005 | Kim .................... G01N 29/036 435/6.19 |
| 2006/0075803 A1 | 4/2006 | Boisen et al. |
| 2010/0045141 A1* | 2/2010 | Pulskamp ........... H01L 41/0933 310/328 |
| 2010/0119711 A1* | 5/2010 | Cady ..................... B01L 3/0248 427/256 |
| 2010/0181871 A1* | 7/2010 | Daniel ..................... G01L 1/16 310/338 |
| 2011/0156528 A1* | 6/2011 | Hong .................... B81B 3/0029 310/300 |
| 2013/0049539 A1* | 2/2013 | Lee ..................... H01L 41/1136 310/339 |

OTHER PUBLICATIONS

P.A. Rasmussen et al., Optimised cantilever biosensor with piezoresistive read-out, Ultramicroscopy, 2003, pp. 371-376, vol. No. 97.

Yu-Hsiang Wang et al., Gas Flow Sensing with a Piezoresistive Micro-Cantilever, IEEE Sensors, EXCO, 2006, pp. 1448-1451, Gaegu, Korea.

* cited by examiner

POLYMER ANCHORED MICROELECTROMECHANICAL SYSTEM (MEMS) CANTILEVER AND METHOD OF FABRICATING THE SAME

CROSS-REFERENCE TO RELATED APPLICATION

This application claims priority under 35 U.S.C. §119(a) on Indian Patent Application No. 204/MUM/2014, filed in India on Jan. 21, 2014, which is hereby incorporated by reference, in its entirety.

FIELD OF THE INVENTION

This invention relates to a polymer anchored microelectromechanical system (MEMS) cantilever and a method of fabricating the same.

BACKGROUND OF THE INVENTION

Microelectromechanical or nanoelectromechanical system (MEMS or NEMS) devices range from very simple structures without moving elements or parts to quite complex systems with several moving elements or parts under control. MEMS devices include transducers such as microcantilevers, microsensors or microactuators, mechanically functional microstructures such as microfluidics such as valves, pumps or flow channels or microengines such as gears, turbines or combustion engines. MEMS devices find a variety of engineering applications including automotive systems, health care applications, automated manufacturing, instrumentation, environmental monitoring and control applications, consumer products or aerospace.

A MEMS cantilever comprises a base and a cantilever beam projecting from the base. Surface of the cantilever is covered with analyte molecules which when come in contact with receptor molecules generate surface stress on the cantilever and cause deflection of the cantilever. Deflection of the cantilever is a function of the receptor molecules and is measured either by electrical read out systems or optical read out systems such as AFM (Atomic Force Microscope). In AFM, microcantilever is used as an imaging probe in sensing various physical, chemical or biological elements. A laser light source is directed onto the cantilever and the reflected beam is sensed by position sensing diode. In electrical read out systems, deflection of the cantilever due to stress is measured as change of electrical property of the cantilever. Optical read out systems are heavy and hefty, complicated in construction and expensive as compared to electrical read out systems. Therefore, electrical read out systems are preferred for low cost sensing applications.

U.S. Pat. No. 8,278,725B2 describes a micromechanical structure and a method of fabricating the same. The micromechanical structure comprises a silicon substrate, a micromechanical element formed directly on the substrate and an undercut (recess) formed in the substrate underneath a released portion of the micromechanical element. U.S. Pat. No. 7,763,947B2 describes a piezothin-filmdiode (piezodiode) cantilever microelectromechanical system (MEMS) and associated fabrication processes. Thin-films are deposited overlying a substrate which can be made of glass, polymer, quartz, metal foil, Si, sapphire, ceramic or compound semiconductor materials. Amorphous silicon (a-Si), polycrystalline Si (poly-Si), oxides, a-SiGe, poly-SiGe, metals, metal-containing compounds, nitrides, polymers, ceramic films, magnetic films and compound semiconductor materials are examples of thin-film materials. A cantilever beam is formed from the thin-films and a diode is embedded with the cantilever beam.

The diode is made from a thin-film shared in common with the cantilever beam. The shared thin-film may be a film overlying a cantilever beam top surface, a thin-film overlying a cantilever beam bottom surface or a thin-film embedded within the cantilever beam. In one aspect, a plasma enhanced chemical vapor deposition (PECVD) method is used to control the MEMS structure thickness and a pre-deposited sacrificial film is used to support the MEMS structure fabrication. The sacrificial film is removed to define an air gap between the MEMS structure and the substrate. The diode is a lateral PIN diode, having a serpentine pattern formed in the Si film layer overlying the cantilever beam top surface.

U.S. Pat. No. 6,720,267B1 describes a method for forming a micro-electromechanical system (MEMS) and more particularly to a method for forming a cantilever beam type MEMS applied in the field of fiber-optic communication. A semiconductor substrate comprising a heavily doped layer and a first dielectric layer formed within the semiconductor substrate is further formed with at least two first conductors connected to a surface of the heavily doped layer in the first dielectric layer. A second dielectric layer not connected to the surface of the heavily doped layer in the first dielectric layer is formed between the first conductors. A patterned sacrificial layer is formed on the semiconductor substrate that covers the second dielectric layer, the first dielectric layer and the first conductors.

A third dielectric layer is formed on the semiconductor substrate that covers the patterned sacrificial layer. A fourth dielectric layer not connected to a surface of the patterned sacrificial layer is formed in the third dielectric layer. At least two second conductors are formed on the third dielectric layer corresponding to the underlying first conductors formed on two sides of the second dielectric layer. The fourth dielectric layer is etched to form a plurality of openings in the fourth dielectric layer. A cap layer is formed on the semiconductor substrate to cover the second conductors, the fourth dielectric layer and the third dielectric layer. The patterned sacrificial layer is finally removed.

U.S. Pat. No. 6,156,216 describes a method for making nitride cantilevers devices for surface probing. A substrate with a top silicon working surface and a bottom silicon working surface is formed with a silicon stylus of a predetermined area with a base and an apex by etching the top surface of the substrate. A nitride layer of a predetermined thickness is deposited on the top silicon working surface and silicon stylus to produce a nitride covered working surface and a nitride covered silicon stylus. A resistive is spin coated on the nitride covered working surface. A predetermined area of the nitride covered silicon stylus is etched to expose apex of the silicon stylus.

U.S. Pat. No. 7,022,540B2 describes a fabrication method of a cantilever sensor by depositing a silicon nitride film respectively onto the top and the bottom surfaces of a silicon substrate. A silicon oxide film is deposited onto the top silicon nitride film. A lower electrode is deposited onto the silicon oxide film. A first piezoelectric film and a second piezoelectric film are deposited onto the lower electrode so as not to contact with each other. An upper electrode is deposited respectively onto the first and second piezoelectric films. A protecting film is deposited onto the silicon oxide film, the lower electrode, the first and second piezoelectric films and the upper electrodes.

A first opening and a second opening are formed on the protecting film of the upper electrode and on the protecting film of the lower electrode, respectively. A first and a second contact pads respectively formed on the first and second openings. Part of the silicon nitride film on the bottom surface of the substrate is removed and a membrane of predetermined thickness is formed by etching the silicon substrate in which the silicon nitride film is removed. A cantilever is formed by removing part of the membrane by etching the surrounding portion of the cantilever.

U.S. Pat. No. 8,393,011B2 describes MEMS devices comprising at least one cantilever and at least one piezoresistor. The cantilever comprises silicon nitride or silicon carbide and the piezo resistor is doped silicon. The MEMS devices are used for height sensing. U.S. Pat. No. 6,886,395B2 describes a method of making a probe having a cantilever and a tip. A substrate having a surface and a tip extending substantially orthogonally from the surface is provided. An etch stop layer is deposited on the substrate to protect the tip followed by a silicon nitride layer on the etch stop layer. An etch operation is used to release the cantilever and expose the etch stop layer protecting the tip. Preferably, the tip is silicon and the cantilever supporting the tip is silicon nitride. U.S. Pat. No. 5,399,232A describes a dielectric cantilever arm stylus with an integrally formed pyramidal tip. The tip is molded in a pyramidal pit etched in a later-removed silicon substrate. An integrally-formed cantilever arm is also formed as the tip is being formed. Various thin film materials form the cantilever arm and the tip. The dielectric is silicon nitride and cantilever arm is anodically bonded to a glass block.

U.S. Pat. No. 5,066,358 describes a method of forming a nitride cantilever with an integral conical silicon tip at the free end thereof. A top layer of silicon dioxide is patterned into a tip mask on a doped or epitaxial silicon layer in a silicon substrate. Photoresist is spun on the silicon substrate and patterned and the silicon is etched to define a cantilever pattern in the substrate with the tip mask positioned to be near the free end of a nitride cantilever to be subsequently formed. A bottom layer of silicon dioxide is formed on the silicon substrate and then patterned and etched to define a masking aperture on the bottom silicon dioxide layer. The bottom of the silicon substrate is anisotropically etched through the masking aperture and the etch stops at the doped silicon layer.

Alternatively, electrochemical etching is done by applying an electric potential across the P-N junction between the doped silicon layer and the appropriately-doped substrate. This releases the free end of the doped silicon layer from the silicon substrate. The anisotropic etch preferentially etches all of the crystal planes of the silicon substrate except the planes to leave a silicon base from which extends the silicon surface layer as a cantilever. A nitride layer is then formed on the silicon substrate and dry etched from the top surface of the doped silicon surface layer to form a nitride cantilever on the bottom of the silicon substrate. The doped silicon layer is etched away while the tip mask helps to form a pointed silicon tip near the free end of the nitride cantilever.

Nitride piezoresistive cantilever comprising a silicon substrate and a nitride layer deposited on the substrate is reported. Nitride is deposited on the substrate by LPCVD (Low-Pressure Chemical Vapor Deposition) technique and the substrate is etched by KOH (potassium hydroxide) to form the cantilever. (Optimised cantilever biosensor with piezoresistive read-out P A Rasmussena, J Thaysenb, O Hansena, S C Eriksena, A Boisen). Low stress nitride cantilever with platinum piezoresistor is also reported. The silicon substrate is etched to form cantilevers. (Gas Flow Sensing with a Piezoresistive Micro-Cantilever Yu-Hsiang Wang, Chia-Yen Lee Rong-Hua Ma Lung-Ming Fu-Taiwan).

US 2006/0075803A1 describes a polymer based cantilever array for use as a sensor comprising a platform and a multitude of polymer-based cantilevers attached to the platform. Each of the cantilevers is coupled to an optical sensing means adapted to sense deformations of an individual cantilever. The cantilevers may be coated with a first layer of metal such as gold and/or a second layer being a molecular layer capable of functioning as a receptor layer for molecular recognition. The cantilever array is fabricated based on photolithography or micromoulding. U.S. Pat. No. 8,122,761B2 describes another polymer based microcantilever sensor including a supporting substrate, a cantilever spring element at least partially disposed over the support substrate, a probe layer disposed over the first side of the cantilever spring element and a piezoresistive transducer attached to the second side of the cantilever spring element. The cantilever spring element is characterized by having a first side and a second side and comprising a polymer having a Young's modulus less than about 100 Gpa.

U.S. Pat. No. 6,136,208 describes a method of manufacturing a planar microprobe comprising a upper cantilever beam including a first electrode, a supporting pad coupled to the upper cantilever beam, and a lower cantilever beam coupled to the supporting pad, situated below the upper cantilever beam and spaced by a distance from the upper cantilever beam. Besides, the lower cantilever beam comprises a second electrode in cooperation with the first electrode to control a vertical displacement of the lower cantilever beam by applying an external voltage thereto. A tip is coupled to the second electrode. The microprobe is manufactured by depositing a photoresist sacrificial layer on a lower cantilever beam. Metal is electroplated to form an upper cantilever beam. Then, residual silicon, silicon oxide and photoresist are etched to release the microprobe.

Cobalt-nickel microcantilevers for biosensing are also reported. Cobalt nickel cantilevers are deposited on copper sacrificial layer and SU8 polymer is used to anchor the cantilevers (Olgaç Ergeneman, Marcel Suter, George Chatzipirpiridis, Kartik M Sivaraman, Patric Eberle, Salvador Pané, Eva Pellicer, Jordi Sort and Bradley J Nelson—Journal of Intelligent Material Systems and Structures published online 17 Oct. 2012).

MEMS devices and fabrication methods as discussed above suffer from one or more of the following problems or disadvantages. Non-polymer cantilever devices are generally expensive and are also complex and complicated in construction. Fabrication methods of the devices involve a large number of steps and are time consuming and cumbersome. Fabrication methods also involve expensive procedures like wafer bonding or DRIE (deep reactive ion etching) or TMAH (tetramethylammonium hydroxide) wet etching and are unsuitable for low cost applications. Substrate either gets consumed or forms a part of the devices. Polymer cantilevers are not stable in liquid medium. There is thus need for MEMS cantilevers which are simple in construction, stable under test conditions like liquid, vapour or gas, robust and cost effective and for methods of fabrication of such cantilevers, which are simple and easy and convenient to be carried out, less time consuming and cost effective.

DESCRIPTION OF THE INVENTION

According to the invention there is provided a polymer anchored microelectromechanical system (MEMS) cantilever, comprising a base and a cantilever beam projecting from the base, wherein the cantilever beam consists of a piezo layer sandwiched between an inorganic material structural layer and an inorganic material encapsulating and immobilising layer and a pair of electrical contacts formed in the encapsulating and immobilising layer in contact with the piezo layer and wherein the base consists of polymer.

According to the invention there is also provided a method of fabricating a polymer anchored microelectromechanical system (MEMS) cantilever, comprising:

i. depositing a sacrificial layer on a substrate;
ii. forming a MEMS cantilever beam on the sacrificial layer by depositing an inorganic material structural layer on the sacrificial layer; depositing a piezo layer on the structural layer; and depositing an inorganic material encapsulating and immobilising layer on the piezo layer;
iii. forming a pair of electrical contacts in the encapsulating and immobilising layer in contact with the piezo layer;
iv. forming a polymer base for the cantilever beam; and
v. etching the sacrificial layer to release the MEMS cantilever beam from the substrate.

The structural layer and the encapsulating and immobilising layer can be made of any thin film forming material and are preferably made of silicon nitride, silicon oxide, silicon carbide or diamond. The piezo layer can be made of any piezoresistive or piezoelectric material which changes electrical properties with stress. The piezo layer is preferably made of polysilicon, graphene, doped zinc oxide, zinc oxide nanowires, silicon nanowires, carbon nanotubes, platinum, gold, indium tin oxide, polyvinylidene difluoride or Dy modified $BiFeO_3$. The polymer base can be made of any photopatternable polymer and is preferably made of SU-8 polymer, which is a highly viscous photoresist polymer consisting of di-glycidol ether of bisphenol A or polymethyl methacrylate polymer.

The sacrificial layer can be any layer capable of being etched. The sacrificial layer, preferably, consists of an adhesion layer consisting of a first chromium layer deposited on the substrate by sputtering and a fast etching layer consisting of a gold layer deposited on the first chromium layer and a second chromium layer deposited on the gold layer, both the gold and second chromium layers being deposited by sputtering. The cantilever beam is released from the substrate by etching the sacrificial layer using a chrome etchant. Preferably the chrome etchant consists of a solution of ceric ammonium nitrate, acetic acid and deionized water. The adhesion layer helps the sacrificial layer to adhere to the substrate and the fast etching layer helps the sacrificial layer to etch out fast from the substrate and release the substrate.

The electrical contacts can be made of any electric conductive material. The electrical contacts preferably consist of a titanium layer at the bottom and a gold layer at the top both deposited by sputtering. The titanium layer improves the adhesion of the gold layer to the piezo layer. The electrical contacts also can be made of titanium-platinum. The structural nitride layer, piezo layer and encapsulating and immobilising nitride layer, all can be deposited by any known techniques.

Preferably these layers are all deposited by CVD (chemical vapour deposition) technique. Preferably the structural layer and encapsulating and immobilising layer consist of silicon nitride deposited by CVD technique using silane and ammonia. Preferably, the piezo layer is polysilicon deposited by CVD technique using silane, diborane and $H_2$ gases. Preferably, the polymer base consists of SU-8 polymer or polymethyl methacrylate formed on the piezo microstructure by spin coating. Preferably, the SU-8 polymer or polymethyl methacrylate polymer is spin coated in cycles and prebaked, UV exposed and postbaked to achieve crosslinking of the polymer. The substrate can be any material that can withstand the fabrication temperatures and is selected from silicon, glass or quartz. Preferably, the substrate is surface cleaned according to RCA protocol prior to depositing the sacrificial layer.

The MEMS cantilever of the invention is mechanically robust as the piezo layer is sandwiched between the structural layer and encapsulating and immobilising layer, which are preferably formed with nitride, a robust material. It has low spring constant and high deflection sensitivity and high resonant frequency. It is stable as it is not exposed to atmospheric conditions and humidity. Therefore, the MEMS cantilever of the invention continues to give high performance for a long period of time and is durable and reliable. It is very cost effective as it is polymer anchored. It is further cost effective because the substrate does not form a part of the cantilever and can be reused. It is very simple in construction and can be used with electrical read out systems as bending of the cantilever translates into change in electrical resistance. Therefore, it is still further cost effective.

The method of fabrication of the cantilever does not involve bulk micromachining. Instead, it uses surface micromachining to fabricate the various layers. Therefore, the method of fabrication of the cantilever is simple, convenient and cost effective to carry out. It also requires comparatively less time because of simple processing. Techniques like sputtering, PLD (Plasma layer deposition) or spin coating also can be used to deposit the structural layer, encapsulating and immobilising layer and piezolayer.

Figure 1A:
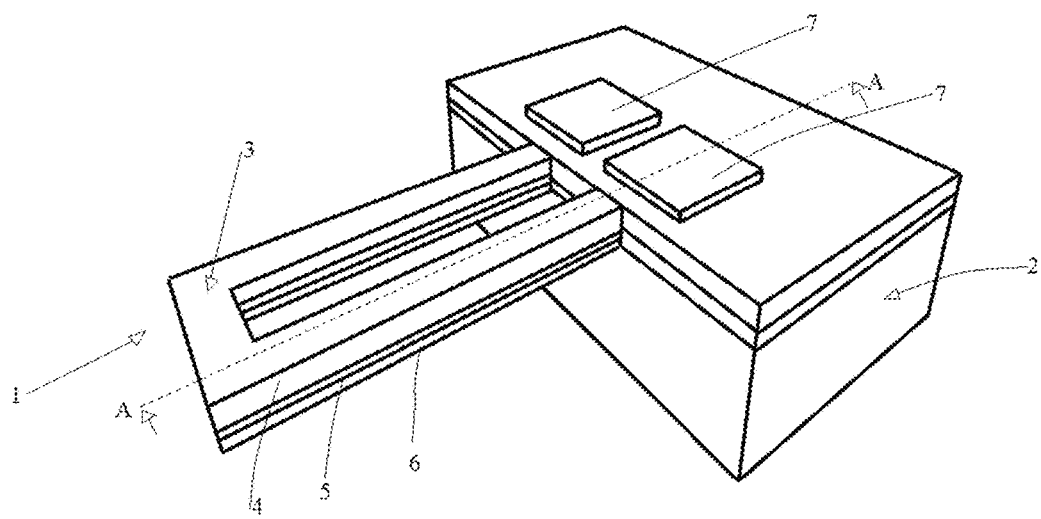
FIG. 1A of the drawings accompanying this specification is an isometric view of the cantilever of the invention.

The following experimental examples are illustrative of the invention but not limitative of the scope thereof:

Example 1

Silicon wafer substrate was surface cleaned according to RCA (Radio Corporation of America) protocol and a sacrificial layer consisting of a bottom adhesion layer of chromium (10 nm thick) and a top galvanic layer or fast etching layer of gold (50 nm thick) at the bottom and chromium (50 nm thick) at the top was deposited on the substrate by sputtering. A structural nitride layer (650 nm thick) was deposited on the sacrificial layer by CVD (chemical vapour deposition) technique using silane and ammonia at a flow rate ratio of 1:20 sccm (standard cubic centimeters per minute), respectively for 60 minutes and at a filament temperature of 1900° C. substrate temperature of 160° C. and chamber pressure of $1.1 \times 10^{-1}$ mbar. Structural nitride layer was patterned using positive photoresist S1813 (Shipley 1813, Microchem, USA) and etched using 5:1 BHF (buffered hydrofluoric acid) followed by stripping the positive photoresist with acetone.

A polysilicon piezo layer (300 nm thick) was deposited on the structural nitride layer by CVD technique using silane, diborane and $H_2$ gases at a flow rate ratio 1:7:10 sccm (standard cubic centimeter per minute) respectively for 30 minutes at a filament temperature of 1900° C., substrate temperature of 170° C. and chamber pressure of $1.1 \times 10^{-1}$ mbar. The polysilicon piezo layer was patterned using S1813 (Shipley S1813, Microchem, USA) and etched using HNA, (a mixture of hydrofluoric acid and nitric acid in deionized water).

An encapsulating and immobilizing nitride layer (125 nm thick) was deposited on the piezo layer by CVD technique using silane and ammonia at a flow rate ratio 1:20 sccm (standard cubic centimeters per minute) respectively for 12 minutes at a filament temperature of 1900° C., substrate temperature of 160° C. and chamber pressure of $1.1 \times 10^{-1}$ mbar. The encapsulating and immobilizing nitride layer was patterned and contact windows were opened in the nitride layer using lithography and the nitride layer was etched with 5:1 BHF (buffered hydrofluoric acid).

Contacts of titanium (20 nm thick) at the bottom and gold (200 nm thick) at the top were deposited in contact with the piezo layer by making contact windows in the encapsulating and immobilising nitride layer by sputtering and lift off techniques. A base or support layer of SU-8 polymer (about 100 μm thick) was spin coated on the nitride-polysilicon-nitride cantilever beam in cycles of 300 rpm for the first 15 seconds followed by 500 rpm for the next 10 seconds, 3000 rpm for next 45 seconds and 500 rpm for the next 10 seconds. The SU8 polymer support layer was prebaked, UV exposed and post baked to cross link the polymer.

Figure 1B:
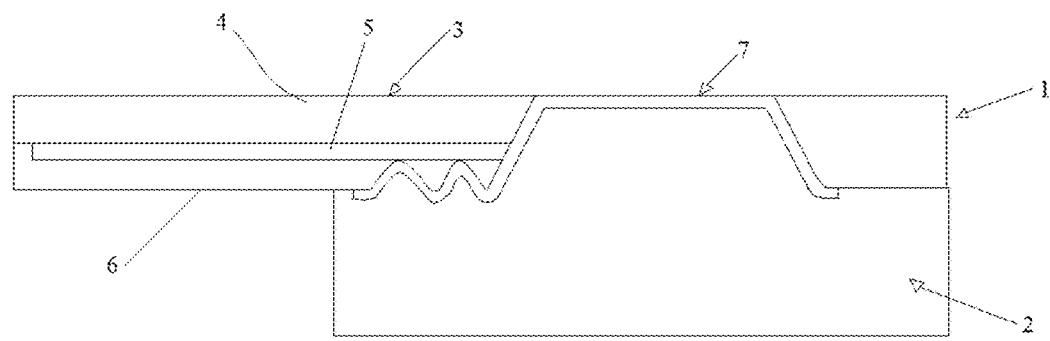
FIG. 1B of the drawings accompanying this specification is a sectional view of the cantilever of FIG. 1A along line A-A.

The cantilever beam was released from the substrate by keeping the cantilever beam with the substrate in a chrome etchant consisting of a solution of ceric ammonium nitrate, acetic acid and deionized water to obtain a microcantilever device 1 as shown in FIG. 1A and FIG. 1B, in which the polymer base and cantilever beam projecting from the base are marked 2 and 3, respectively. The structural layer, piezolayer and encapsulating and immobilising layer of the cantilever beam are marked 4, 5 and 6 respectively. Electrical contacts of the cantilever are marked 7. The cantilever beam had a thickness of 1075 nm as measured by profilometer.

Example 2

Figure 2:
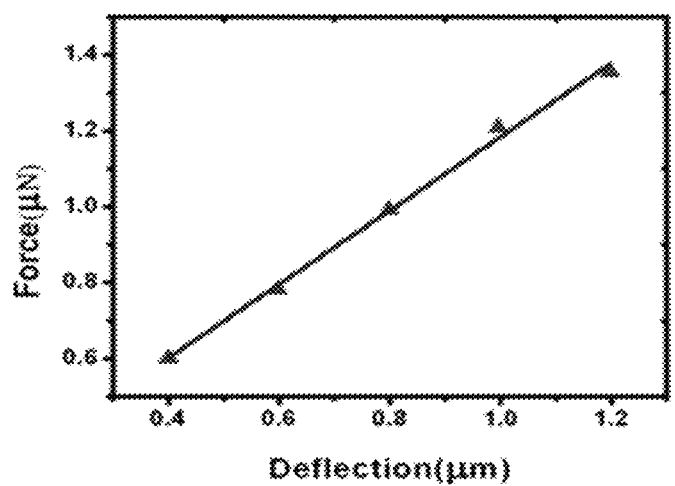
FIG. 2 of the drawings accompanying this specification is a graph showing the relationship between force vs deflection of the cantilever of the invention.
Figure 3:
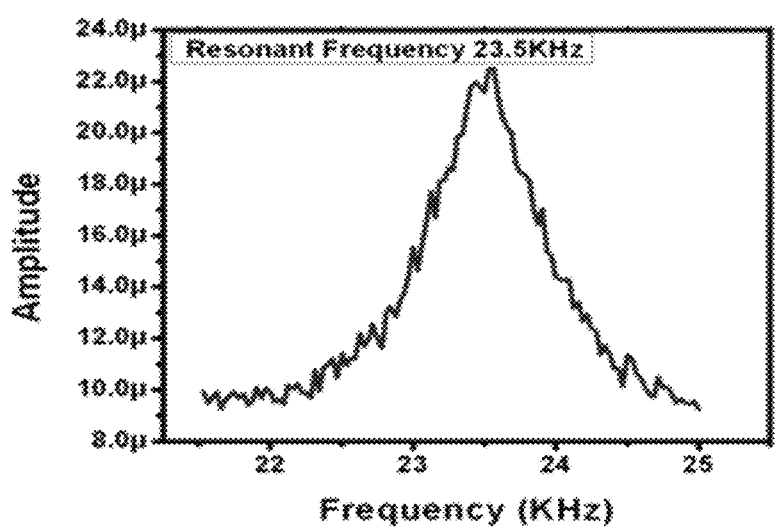
FIG. 3 of the drawings accompanying this specification is a graph representing the natural resonant frequency of the cantilever of the invention.
Figure 4:
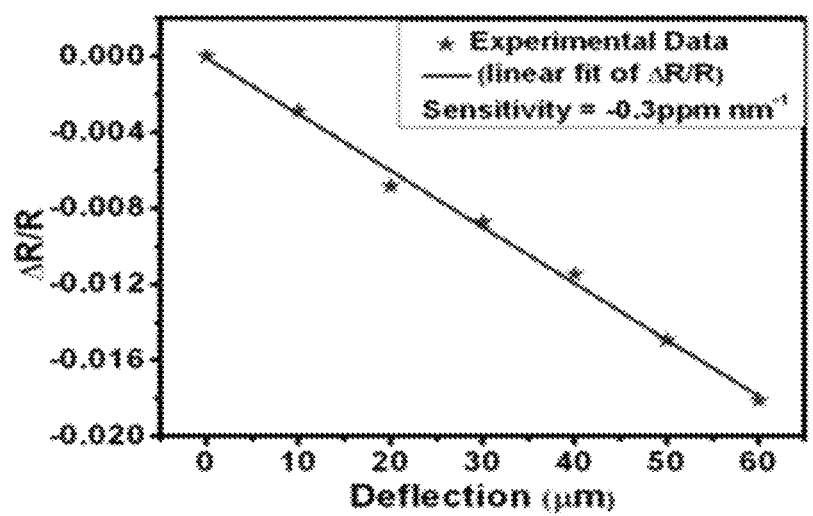
FIG. 4 is a graph representing relationship between delta R/R vs deflection of the cantilever of the invention.

Mechanical and electromechanical properties of the cantilever of Example 1 were measured as follows:
i) Spring Constant Spring constant of the cantilever (ratio of force to deflection) was measured by the beam-bending technique using Berkovich Indenter and Hysitron Triboscope. Tip of the Indenter was placed at the apex of the cantilever and force was applied at the tip to vary the displacement of the tip from 100 nm to 1200 nm. At various displacements of the tip, load or force versus displacement was plotted to obtain a graph as shown in FIG. 2 of the drawings accompanying this specification. Spring constant of the cantilever as deduced from FIG. 2 is 0.9 N/m.
ii) Resonant Frequency Resonant frequency measurements of the cantilever were performed in air using Polytec Laser Doppler Vibrometer (LDV). Die was mounted on a piezo buffer to provide actuation to the cantilever. Measurement results were as shown in FIG. 3 of the drawings accompanying this specification. Measured resonant or natural frequency of the first mode of vibration as given by LDV was 23.5 KHz and quality factor Q as estimated from the plot was 28. FIG. 3 clearly shows that the cantilever of the invention has high resonant frequency so as not to be susceptible to external noise which falls in the range of 5 KHz and below.
iii) Deflection Sensitivity Deflection sensitivity measurement of the cantilever was carried out by deflecting the tip of the cantilever with a precalibrated micromanipulator needle and simultaneously measuring the voltage and current using a Keithley 4200 source measuring unit. One probe of the measuring unit was placed at the tip of the cantilever and the two other probes of the measuring unit were placed at the two contacts of the cantilever. Needle at the tip of the cantilever was moved in the z direction in steps of 10 micrometer with the help of the manipulator. Current and voltage measurements were done at the same time. Relative change in resistance as a function of deflection was plotted as shown in FIG. 4 of the drawings accompanying this specification. Slope of the graph gave the deflection sensitivity of the cantilever. Deflection sensitivity of the cantilever as deduced from the graph in FIG. 4 is $0.3 \times 10^{-6}$ $nm^{-1}$. Deflection sensitivity is an important measure for cantilever based sensor applications.

We claim:

1. A polymer anchored microelectromechanical system (MEMS) cantilever, comprising:
    a base; and
    a cantilever beam projecting from the base, consisting of:
        an inorganic material structural layer;
        an inorganic material encapsulating and immobilising layer; and
        a piezo layer sandwiched between the inorganic material structural layer and the inorganic material encapsulating and immobilising layer; and
        a pair of electrical contacts formed in the inorganic material encapsulating and immobilising layer and in contact with the piezo layer,
    wherein the base consists of polymer, and each of the inorganic material structural layer and the inorganic material encapsulating and immobilising layer is formed of a material that is selected from silicon nitride, silicon oxide, silicon carbide or diamond; and
    wherein the cantilever beam is released from a substrate by etching a sacrificial layer between the cantilever beam and the substrate using a chrome etchant to form the cantilever devoid of the substrate; and
    wherein the sacrificial layer comprises an adhesion layer consisting of a first chromium layer deposited on the substrate, and a fast etching layer consisting of a gold layer deposited on the first chromium layer and a second chromium layer deposited on the gold layer.

2. The cantilever as claimed in claim 1, wherein the piezo layer is selected from polysilicon, graphene, doped zinc oxide, zinc oxide nanowires, silicon nanowires, carbon nanotubes, platinum, gold, indium tin oxide, polyvinylidene difluoride or Dy modified BiFeO3.

3. The cantilever as claimed in claim 1, wherein the electrical contacts consist of titanium-gold or titanium-platinum.

4. The cantilever as claimed in claim 1, wherein the polymer base consists of SU-8 polymer or polymethyl methacrylate polymer.

* * * * *